United States Patent
Geng et al.

(10) Patent No.: US 11,416,236 B2
(45) Date of Patent: Aug. 16, 2022

(54) OVER-THE-AIR (OTA) UPDATING OF PARTIALLY COMPRESSED FIRMWARE

(71) Applicant: QUALCOMM Incorporated, San Diego, CA (US)

(72) Inventors: Nieyan Geng, San Diego, CA (US); Gurvinder Singh Chhabra, San Diego, CA (US); Chenyang Liu, San Diego, CA (US); Chuguang He, San Marcos, CA (US)

(73) Assignee: Qualcomm Incorporated, San Diego, CA (US)

( * ) Notice: Subject to any disclaimer, the term of this patent is extended or adjusted under 35 U.S.C. 154(b) by 83 days.

(21) Appl. No.: 16/028,321

(22) Filed: Jul. 5, 2018

(65) Prior Publication Data

US 2019/0012164 A1 Jan. 10, 2019

Related U.S. Application Data

(60) Provisional application No. 62/530,039, filed on Jul. 7, 2017.

(51) Int. Cl.
*G06F 8/65* (2018.01)
*H03M 7/30* (2006.01)
(Continued)

(52) U.S. Cl.
CPC ............... *G06F 8/65* (2013.01); *G06F 8/654* (2018.02); *G06F 8/658* (2018.02); *H03M 7/30* (2013.01); *H04L 67/34* (2013.01); *H04L 69/04* (2013.01)

(58) Field of Classification Search
CPC ............ G06F 8/654; G06F 8/658; G06F 8/65; H03M 7/30; H04L 67/34
See application file for complete search history.

(56) References Cited

U.S. PATENT DOCUMENTS

| | | | |
|---|---|---|---|
| 7,222,258 B2 * | 5/2007 | Rothman | G06F 8/4436 714/6.32 |
| 7,669,195 B1 * | 2/2010 | Qumei | G06F 8/654 717/170 |

(Continued)

FOREIGN PATENT DOCUMENTS

EP  2012230 A1  1/2009

OTHER PUBLICATIONS

Y. Wee and T. Kim, "A new code compression method for FOTA," in IEEE Transactions on Consumer Electronics, vol. 56, No. 4, pp. 2350-2354, Nov. 2010. (Year: 2010).*

(Continued)

*Primary Examiner* — Phillip H Nguyen
(74) *Attorney, Agent, or Firm* — Edward J. Meisarosh (57) ABSTRACT

Embodiments of the present disclosure include systems and methods for efficient over-the-air updating of firmware having compressed and uncompressed segments. The method includes receiving a first update to the firmware via a radio, wherein the first update includes a first uncompressed segment and a first compressed segment, receiving a second update to the firmware, wherein the second update corresponds to the first compressed segment, compressing the second update to generate a compressed second update, applying the first update to the firmware, and applying the compressed second update to the firmware to generate an updated firmware.

18 Claims, 5 Drawing Sheets

(51) Int. Cl.
 *H04L 67/00* (2022.01)
 *G06F 8/654* (2018.01)
 *H04L 69/04* (2022.01)
 *G06F 8/658* (2018.01)

(56) References Cited

U.S. PATENT DOCUMENTS

| | | | | |
|---|---|---|---|---|
| 7,716,414 | B2* | 5/2010 | Slyz | G06F 8/658 |
| | | | | 717/173 |
| 9,298,444 | B2 | 3/2016 | Hirao et al. | |
| 9,778,928 | B1* | 10/2017 | Steshenko | G06F 8/44 |
| 2003/0154471 | A1* | 8/2003 | Teachman | G06F 8/65 |
| | | | | 717/171 |
| 2005/0078399 | A1* | 4/2005 | Fung | G11B 20/00007 |
| | | | | 360/69 |
| 2006/0190939 | A1* | 8/2006 | Chen | G06F 8/65 |
| | | | | 717/168 |
| 2008/0098160 | A1* | 4/2008 | Slyz | G06F 8/658 |
| | | | | 711/103 |
| 2008/0117991 | A1 | 5/2008 | Peddireddy et al. | |
| 2008/0119178 | A1 | 5/2008 | Peddireddy et al. | |
| 2010/0175062 | A1 | 7/2010 | Kim | |
| 2010/0313194 | A1 | 12/2010 | Juneja | |
| 2010/0325523 | A1* | 12/2010 | Slyz | G06F 11/1433 |
| | | | | 714/773 |
| 2011/0231834 | A1 | 9/2011 | Kim | |
| 2016/0034488 | A1* | 2/2016 | Schillinger | H04L 67/34 |
| | | | | 707/693 |
| 2016/0378352 | A1* | 12/2016 | Khan | G06F 3/0608 |
| | | | | 711/103 |
| 2017/0090902 | A1 | 3/2017 | Bainville et al. | |
| 2017/0212750 | A1* | 7/2017 | Stutzenberger | G06F 8/654 |
| 2017/0286093 | A1* | 10/2017 | Steshenko | G06F 8/71 |
| 2017/0322796 | A1* | 11/2017 | Kim | G06F 8/658 |
| 2018/0364949 | A1* | 12/2018 | Aston | G06F 3/061 |

OTHER PUBLICATIONS

M. Novak and P. Skryja, "Efficient Partial Firmware Update for IoT Devices with Lua Scripting Interface," 2019 29th International Conference Radioelektronika (Radioelektronika), Pardubice, Czech Republic, 2019, pp. 1-4. (Year: 2019).*

International Search Report and Written Opinion—PCT/US2018/041112—ISA/EPO—dated Oct. 19, 2018.

* cited by examiner

OVER-THE-AIR (OTA) UPDATING OF PARTIALLY COMPRESSED FIRMWARE

The present Application for Patent claims priority to Provisional Application No. 62/530,039 entitled "Over-The-Air (OTA) Updating of Partially-compressed Firmware" filed Jul. 7, 2017, and assigned to the assignee hereof and hereby expressly incorporated by reference herein.

BACKGROUND

Embodiments of the present disclosure relate generally to over-the-air (OTA) updates and more particularly, to firmware OTA (FOTA) updates.

FOTA updates allow vendors to automatically update the firmware of a wirelessly networked electronic device and/or a subset of its components. FOTA technology is commonly used, for example, to update the firmware of mobile smartphones. This allows vendors to fix bugs, implement patches, add features, and/or otherwise update firmware in a more consistent and timely fashion than previous technologies that may have, for example, required an end user to tether the mobile device with a cable to a computer and manually install the update.

One conventional method for updating firmware OTA includes transmitting the updated image file of the firmware to the wirelessly networked electronic device, whereupon the device overwrites the old firmware with the updated firmware and then reboots in order to effectuate the update. Other methods may reduce the transmitted file size and, consequently, allow for faster updates that use fewer device resources. This size reduction may be particularly useful for devices with limited power and/or communication bandwidth, such as, for example, Internet of Things (IoT) devices IoT devices are, generally, small, wirelessly networked electronic devices that connect to the Internet and may perform any of a myriad of functions. FOTA technology may be used to autonomously update IoT device firmware. Many IoT devices are intended for extended use with a battery, without recharging or otherwise receiving external power, and, generally, without human maintenance. Consequently, strategies to reduce power consumption by IoT devices are useful for extending their lives.

One conventional way of increasing the efficiency of FOTA updates is the use of a delta file. When a new firmware image is generated to replace a previous firmware image, the new image is compared to the previous firmware image to generate the delta file, which encodes the changes from the previous version to the new version. Since a typical firmware update changes only a small segment of the firmware image, the delta file is typically much smaller than the firmware image file. The vendor then transmits the delta file to the electronic device, which then applies the changes encoded in the delta file to replace the previous firmware image with the new firmware image. The device then reboots to effectuate the update.

SUMMARY

The following presents a simplified summary of one or more embodiments in order to provide a basic understanding of such embodiments. This summary is not an extensive overview of all contemplated embodiments, and is not intended to identify key critical elements of all embodiments or delineate the scope of all embodiments. Its sole purpose is to present some concepts of one or more embodiments in a simplified form as a prelude to the more detailed description that is presented later.

In one embodiment, a computing device comprises a processor, a memory, and a radio transceiver. The memory is adapted to store firmware. The processor is adapted to receive a first delta file via the radio, wherein the first delta file is used to generate a first firmware update file that includes a first uncompressed segment and a first compressed segment, receive a second delta file via the radio, wherein the second delta file is used to generate a compressed firmware update file that corresponds to the first compressed segment, apply the first firmware update to the firmware to generate an intermediate firmware, and apply the compressed firmware update to the intermediate firmware to generate an updated firmware.

In another embodiment, a method for a computing device co a processor, a memory, and a radio transceiver, comprises: storing, in the memory, a baseline firmware comprising a first baseline uncompressed segment and a first baseline compressed segment; receiving a first delta file, wherein the first delta file is used to generate an intermediate firmware that includes a first intermediate uncompressed segment and a first intermediate compressed segment; receiving a second delta file, wherein the second delta file is used to generate a first update compressed segment that corresponds to the first baseline compressed segment and the first intermediate compressed segment; applying the first delta file to the baseline firmware to generate the intermediate firmware; and applying the first update compressed segment to the intermediate firmware to generate an updated firmware.

To the accomplishment of the foregoing and related ends, the one or more embodiments comprise the features hereinafter fully described and particularly pointed out in the claims. The following description and the annexed drawings set forth in detail certain illustrative features of the one or more embodiments. These features are indicative, however, of but a few of the various ways in which the principles of various embodiments may be employed, and this description is intended to include all such embodiments and their equivalents.

BRIEF DESCRIPTION OF THE DRAWINGS

The disclosed embodiments will hereinafter be described in conjunction with the appended drawings, provided to illustrate and not to limit the disclosed embodiments, wherein like designations denote like elements, and in which.

DETAILED DESCRIPTION

Various embodiments are now described with reference to the drawings. In the following description, for purposes of explanation, numerous specific details are set forth in order to provide a thorough understanding of one or more embodiments. It may be evident, however, that such embodiment(s) may be practiced without these specific details. Additionally, the term "component" as used herein may be one of the parts that make up a system, may be hardware, firmware, and/or software stored on a computer-readable medium, and may be divided into other components.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

Figure 1:
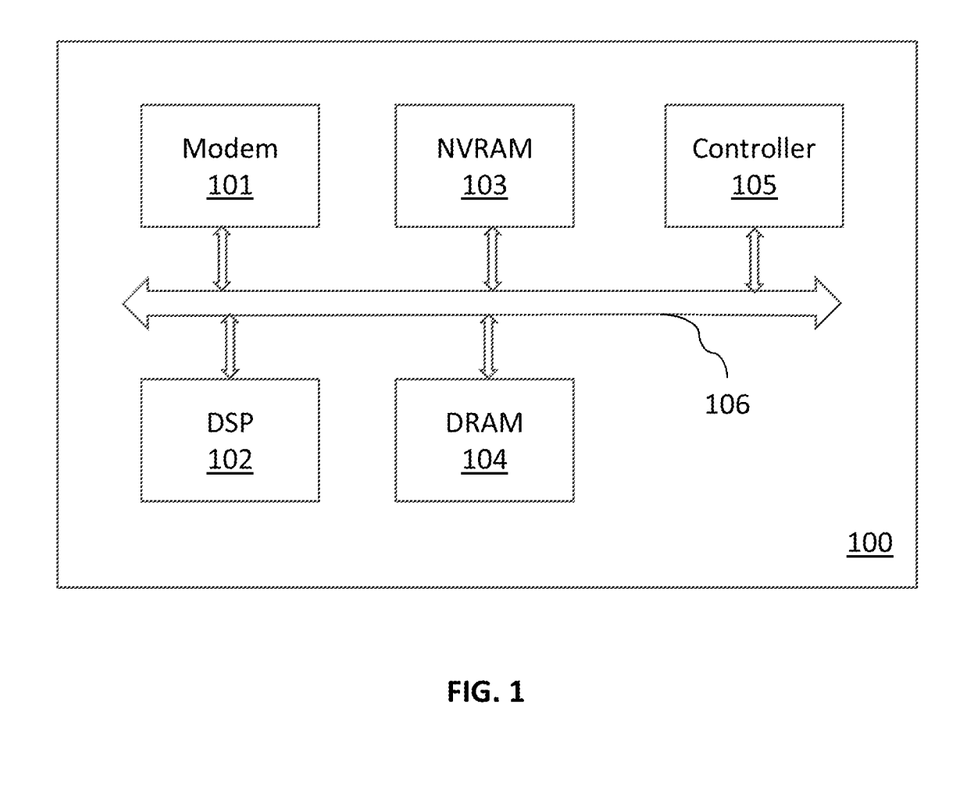
FIG. 1 is a simplified schematic diagram of an exemplary electronic device in accordance with one embodiment.

FIG. 1 is a simplified schematic diagram of an exemplary electronic device 100 in accordance with one embodiment. The device 100 comprises a controller 105, a digital signal processor (DSP) 102, a radio modem 101, a non-volatile random access memory (NVRAM) 103, a dynamic RAM (DRAM) 104, and a system bus 106 interconnecting the above-listed components. The NVRAM 103 may be, for example, a NAND flash RAM. The DRAM 104 may be, for example, a double data rate (DDR) DRAM. Note that, in alternative embodiments, the device 100 may lack the system bus 106 and, instead, the components of the device 100 may be linked to a subset of the other components by direct links or limited buses. Also note that, in alternative embodiments, there may be fewer or more components than described here.

The firmware, for example, for the modem 101 may be a modem peripheral subsystem software (MPSS) image in an executable and linkable format (ELF) that is stored in NVRAM 103. An ELF file includes a header and one or more segments, where each segment contains zero or more sections. An ELF file may further include (1) an optional program header table that identifies the segments and (2) an optional section header table that identifies the sections. The segments typically include code and/or data, where the data may be read-only data or rewritable data.

During bootup of the device 100, the stored MPSS image is loaded from the NVRAM 103 into the DRAM 104 for booting. This is done since the devices can interact with the DRAM 104 much faster than with the NVRAM 103. Once loaded into the DRAM 104, the MPSS may be used in operation by the modem 101 and/or the controller 105. Since memory storage is a limited resource on the device 100, one or more segments of the MPSS file may be compressed on the DRAM 104 and/or NVRAM 103. For example, segments that contain read-only data, which are rarely accessed and never rewritten, can be compressed without significant impact on the operation of the device 100. The compression may utilize any suitable compression algorithm.

During operation of the device 100, the DRAM 104 may use demand paging, which maintains (1) an uncompressed zone containing uncompressed information (e.g., data and/or code) that is typically accessed relatively often and (2) a compressed zone that includes (a) compressed information that is accessed relatively rarely and (b) a swap area into which portions of the compressed information that are momentarily needed are uncompressed into for the duration that they are needed. Depending on the compression ratio, demand paging can greatly reduce the total amount of physical DRAM memory used compared to maintaining all of the information uncompressed, while having minimal effect on performance.

Figure 2:
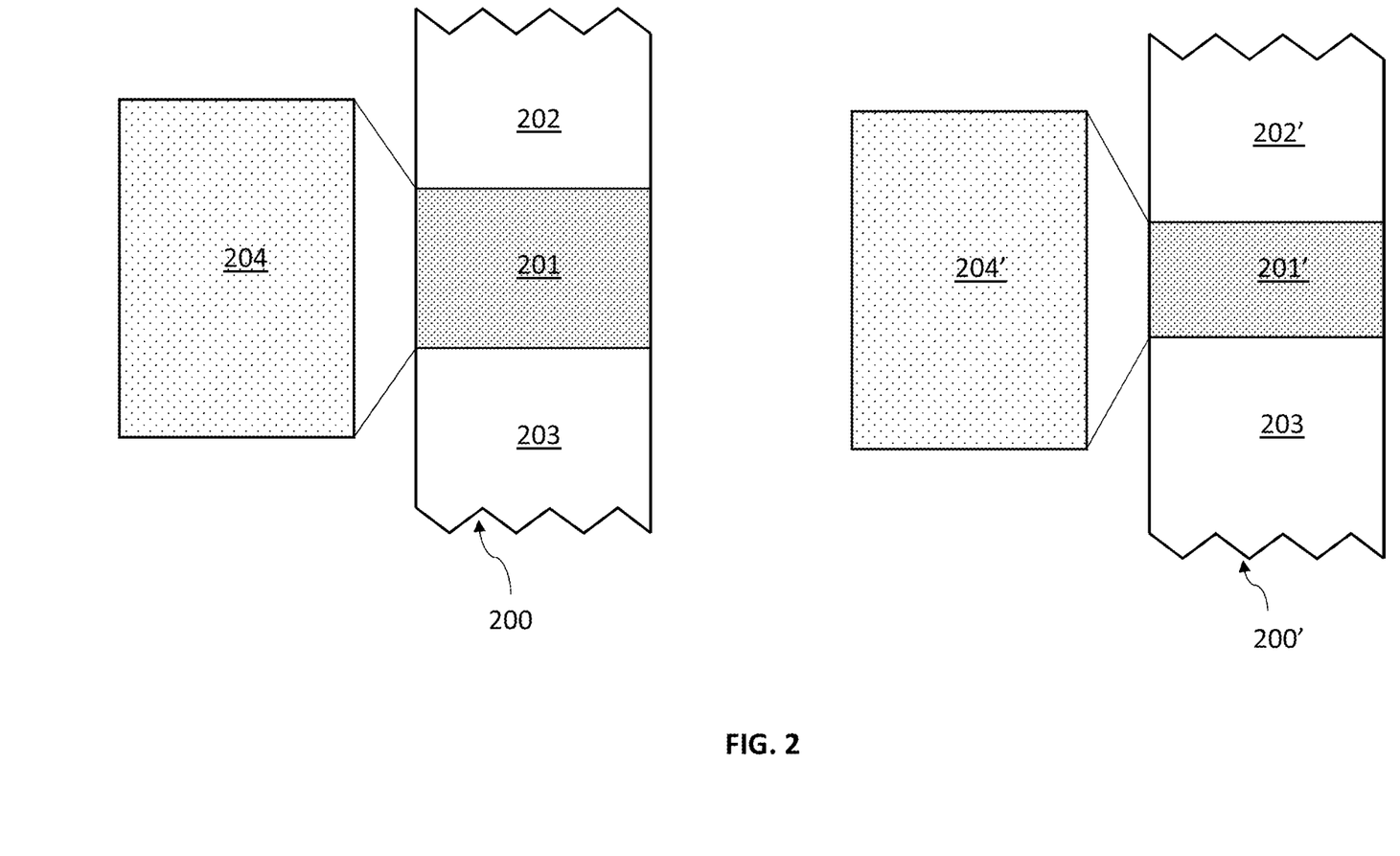
FIG. 2 is a representation of a portion of a baseline firmware image and a corresponding portion of a corresponding updated firmware file.

FIG. 2 is a representation of a portion of a baseline firmware image 200 and a corresponding portion of a corresponding updated firmware file 200'. The baseline firmware image 200 includes a compressed segment 201 and uncompressed segments 202 and 203. The updated firmware image 200' includes (1) an updated compressed segment 201' corresponding to baseline segment 201 of the baseline firmware image 200, (2) an updated uncompressed segment 202' corresponding to segment 202 of the baseline firmware image 200, and (3) an uncompressed segment 203, which is identical to the corresponding segment 203 of the baseline firmware image 200. In other words, FIG. 2 shows that the firmware update changes segments 202 and 201 and leaves segment 203 unchanged.

As noted above, the conventional FOTA process involves generating a delta file representing the differences between the baseline file 200 and the updated file 200'. The comparison and delta file generation may be performed by using a third-party application, utility, or library. The comparison might not take into account the segment breakdowns of the files compared, but the comparison is nevertheless affected by how the different segments are transformed by the update. For example, since segment 203 is identical in both files, the comparison application should note that a corresponding segment of the image file contains no changes, though it might have a shift in location within the image file.

Significantly, a small change in an uncompressed precursor segment 204—corresponding to the compressed segment 201—that produces a fairly similar uncompressed precursor 204', can result in a corresponding compressed segment 201' that is drastically different from the compressed segment 201 because of the ways changes can propagate in compression algorithms. This means that a small update to uncompressed precursor segment 204 can result in large changes between compressed baseline segment 201 and compressed updated segment 201' and, consequently, the generation of a disproportionately large changes section in the delta file for the update from the image 200 to the image 200'. A modified updating process, however, may reduce the size of the transmitted changes for a firmware update. Note that, as used herein, the term precursor refers to the uncompressed version of a compressed segment of a file, whether prior to compression or following decompression.

Figure 3:
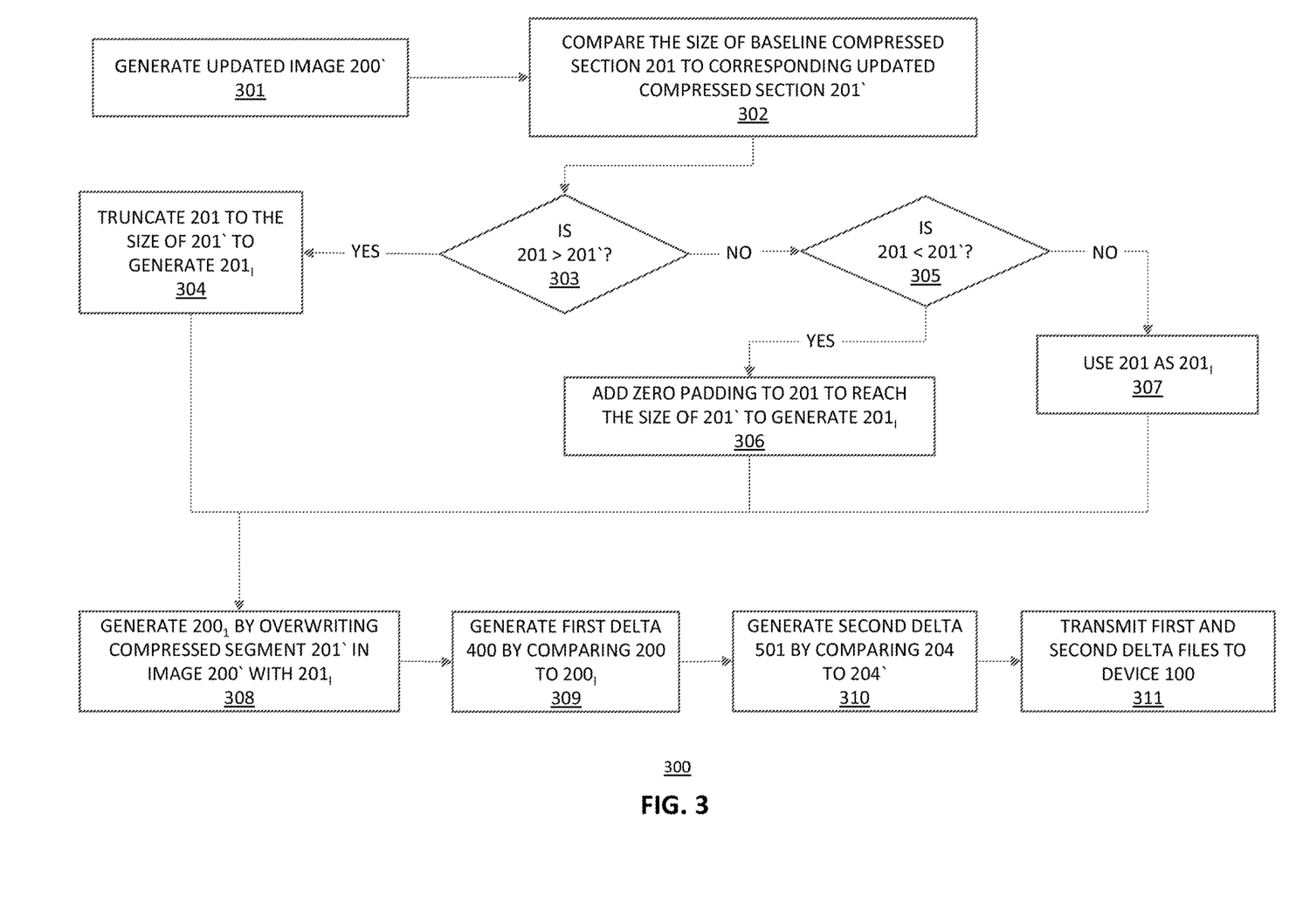
FIG. 3 is a flowchart for an updating procedure in accordance with one embodiment.
Figure 4:
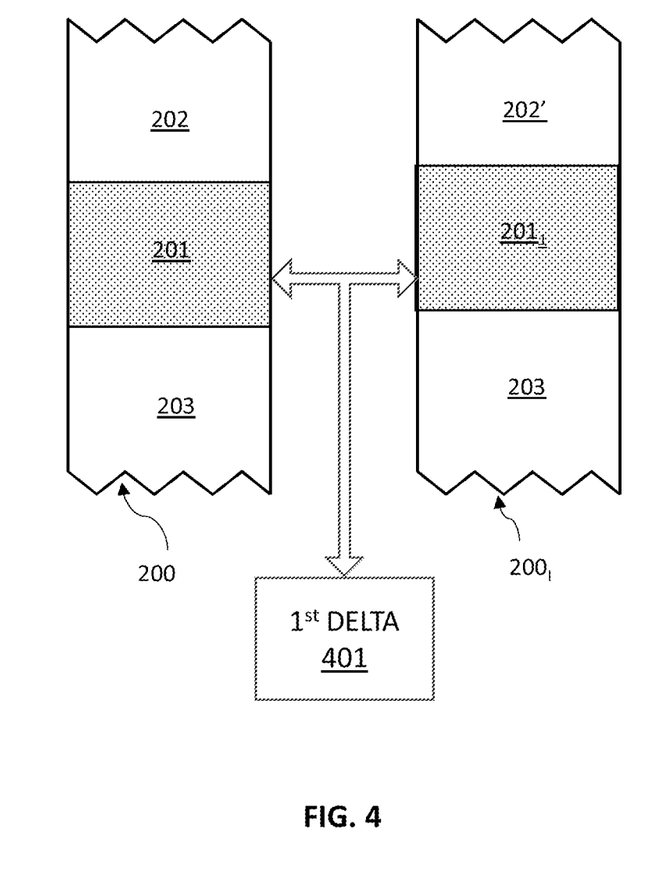
FIG. 4 is a representation illustrating steps in the procedure of FIG. 3.
Figure 5:
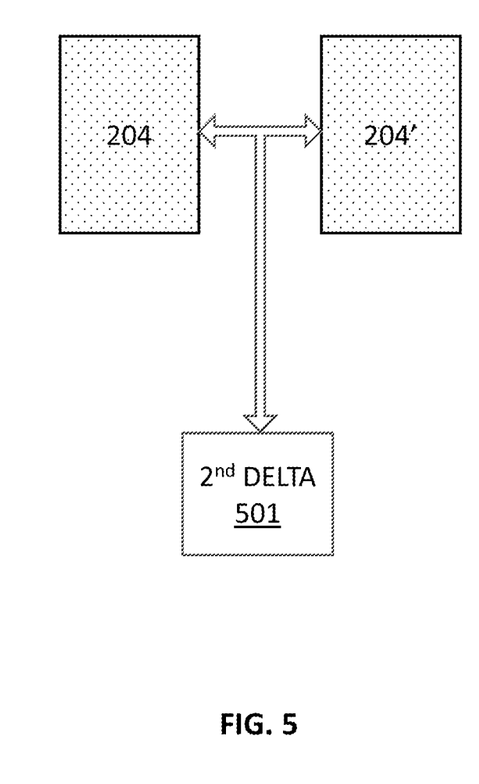
FIG. 5 is a representation illustrating steps in the procedure of FIG. 3.

FIG. 3 is a flowchart for an updating procedure 300 in accordance with one embodiment. FIG. 4 and FIG. 5 are representations illustrating steps in procedure 300 of FIG. 3. When it is determined that a firmware update is to be issued in accordance with the procedure 300, then an updated firmware image 200' is generated (step 301). The firmware update includes changes to uncompressed precursor 204, which results in updated precursor 204' that is then compressed to generate compressed segment 201'. The size of the compressed baseline segment 201 is compared to the size of the updated segment 201' (step 302). If the compressed baseline segment 201 is larger than the compressed updated segment 201' (step 303), then baseline segment 201 is truncated to the size of segment 201' to generate an intermediate compressed segment $201_I$ (step 304).

Note that, while truncating usually involves the exclusion of bits from the end of the segment 201, in alternative embodiments, the intermediate compressed segment $201_I$ may be generated by excluding bits from the start of segment 201 or from both the start and the end of segment 201.

Importantly, the resultant intermediate compressed segment $201_I$ is identical to a subsection of the baseline compressed segment 201 and is the same size as the updated compressed segment 201'. This will result in minimal contribution to the below-described delta file Δ1 from the update of the compressed segment 201, thereby reducing the size of the delta file $Δ_I$.

If in step 303 it was determined that segment 201 is not larger than segment 201', then it is determined whether the size of compressed baseline segment 201 is less than the size of compressed updated segment 201' (step 305). If the segment 201 is smaller than the segment 201', then the segment 201 is zero-padded up to the size of the compressed updated segment 201' to generate the intermediate compressed segment $201_I$ (step 306). Note that, while zero-padding usually involves the appending of zeroes to the end of the segment 201, in alternative embodiments, intermediate compressed segment $201_I$ may be generated by adding zeroes to the start or both start and end of the segment 201. In addition, in alternative embodiments, the padding may be with ones instead of zeroes. Importantly, the resultant intermediate compressed segment $201_I$ includes a subsection identical to the baseline compressed segment 201 and is the same size as the updated compressed segment 201'. This will result in minimal contribution to the below-described delta file Δ1 from the update of the compressed segment 201, thereby reducing the size of the delta file $Δ_I$.

If in step 305 it was determined that segment 201 is not smaller than segment 201', then that means that they are the same size. Consequently, the baseline compressed segment 201 is used as the intermediate compressed segment $201_I$ (step 307). Note that while a particular sequence of comparisons was described above, alternative embodiments may use different comparisons to achieve the same result, which is to generate an intermediate compressed segment $201_I$ that is the same size as the updated compressed segment 201' and is minimally different from the baseline compressed segment 201.

If in step 305 it was determined that segment 201 is not smaller than segment 201', then that means that they are the same size. Consequently, the baseline compressed segment 201 is used as the intermediate compressed segment $201_I$ (step 307). Note that while a particular sequence of comparisons was described above, alternative embodiments may use different comparisons to achieve the same result, which is to generate an intermediate compressed segment $201_I$ that is the same size as the updated compressed segment 201' and is minimally different from the baseline compressed segment 201.

Once the intermediate compressed segment $201_I$ is generated (step 304, 306, or 307), intermediate image file $200_I$ (shown in FIG. 4) is generated by overwriting the compressed updated segment 201' in the updated image file 200' with the intermediate compressed segment $201_I$ (step 308). Subsequently, as illustrated in FIG. 4, a first delta file 401 is generated by comparing the baselines image file 200 to the intermediate image file $200_I$ (step 309) and, as illustrated in FIG. 5, a second delta file 501 is generated by comparing the baseline precursor uncompressed segment 204 to the updated precursor uncompressed segment 204' (step 310). Note that the first and second delta files 401 and 501 may be generated in any order. After the first and second delta files 401 and 501 are generated, they are transmitted to the electronic device 100 for further processing (step 311). The transmission may include additional information to provide guidance to the device 100 for updating its firmware using the first and second delta files 401 and 501.

Figure 6:
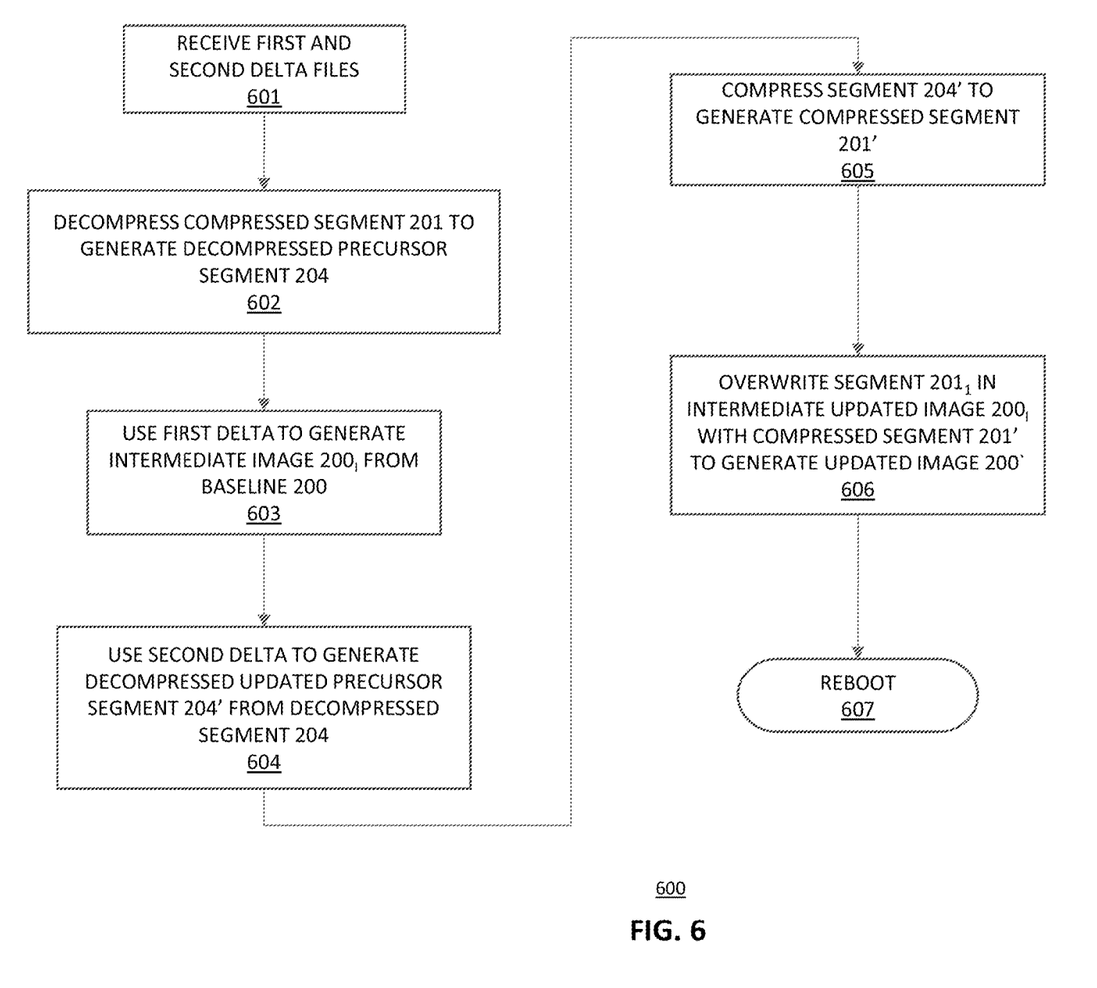
FIG. 6 is a flowchart for an updating procedure performed on the device of FIG. 1 in accordance with an embodiment.

The controller 105 also applies the second delta file 501 to the baseline precursor segment 204 to generate the decompressed updated precursor segment 204' (step 604) and compresses the updated segment 204' to generate the compressed updated segment 201' (step 605). Note that the delta files may be applied in any order. Subsequently, the controller 105 overwrites the intermediate compressed segment $201_I$ in the intermediate image file $200_I$ to generate the updated image file 200' (step 606). Subsequently, the device 100 reboots (step 607) to effectuate the firmware update.

Note that updates for firmware files with multiple compressed segments may be performed using the above-described techniques. In some implementations, a corresponding delta file can be generated and transmitted, as described above, for each compressed segment. For example, if a firmware file has three compressed segments, then the above-described process could be used for each of the compressed segments and a total of four delta files would be generated—one for the entirety of the firmware and three for the compressed segments. The device would then process the first and second delta files as described above and the third and fourth delta files in the same way as the second delta file. Note that the first delta file may be referred to as a primary delta file and the other delta files may be referred to as secondary delta files. Note that if a compressed segment has no updates, then it may be excluded from the above-described processing so that fewer delta files are generated, transmitted, and processed.

Note that although embodiments have been described that involved FOTA, the invention is not necessarily limited to firmware and OTA updates.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above can be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described embodiments may be described or claimed in the singular, the plural is contemplated unless limitation to the singular is explicitly stated. Additionally, all or a portion of any embodiment may be utilized with all or a portion of any other embodiment, unless stated otherwise. Thus, the disclosure is not to be limited to the examples and designs described herein but is to be accorded the widest scope consistent with the principles and novel features disclosed herein.

What is claimed is:

1. A computing device comprising a processor, a memory, and a radio transceiver, wherein:
   the memory is adapted to store a baseline firmware comprising:
      a first baseline uncompressed segment; and
      a first baseline compressed segment having a first size;
   the processor is adapted to:
      receive a first delta file for the baseline firmware;
      receive a second delta file for the first baseline compressed segment;
      apply the first delta file to the baseline firmware to generate an intermediate firmware comprising:
         a first updated uncompressed segment; and
         a first intermediate compressed segment having a second size, wherein:
            the first intermediate compressed segment is different from the first baseline compressed segment; and
            the second size is different from the first size;
      apply the second delta file to an uncompressed baseline precursor segment corresponding to the first baseline compressed segment to generate a first updated compressed segment having the second size; and
      replace the first intermediate compressed segment in the intermediate firmware with the first updated compressed segment to generate an updated firmware.

2. The computing device of claim 1, wherein the processor is adapted to apply the second delta file to an uncompressed precursor segment to generate a first updated compressed segment by:
   applying the second delta file to the uncompressed baseline precursor segment to generate an uncompressed updated precursor segment; and
   compressing the uncompressed updated precursor segment to generate the first updated compressed segment.

3. The computing device of claim 2, wherein the processor is adapted to dynamically generate the uncompressed baseline precursor segment by decompressing the first baseline compressed segment.

4. The computing device of claim 2, wherein the uncompressed baseline precursor segment is retrieved from the memory.

5. The computing device of claim 1, wherein the first intermediate compressed segment is a subsection of the first baseline compressed segment.

6. The computing device of claim 1, wherein the first intermediate compressed segment comprises the first baseline compressed segment and padding bits.

7. The computing device of claim 1, wherein the first and second delta files are received via the radio transceiver.

8. The computing device of claim 1, wherein the processor is adapted to:
   receive a third delta file for a second baseline compressed segment;
   apply the third delta file to the second baseline compressed segment to generate a second updated compressed segment; and
   replace a second intermediate compressed segment in the intermediate firmware with the second updated compressed segment to generate the updated firmware.

9. The computing device of claim 1, wherein the size of the first intermediate compressed segment is the same as the size of the first updated compressed segment.

10. A method for a computing device comprising a processor, a memory, and a radio transceiver, the method comprising:
   storing, in the memory, a baseline firmware comprising:
      a first baseline uncompressed segment; and
      a first baseline compressed segment having a first size;

receiving a first delta file for the baseline firmware;
receiving a second delta file for the first baseline compressed segment;
applying the first delta file to the baseline firmware to generate an intermediate firmware comprising:
  a first updated uncompressed segment; and
  a first intermediate compressed segment having a second size, wherein:
    the first intermediate compressed segment is different from the first baseline compressed segment; and
    the second size is different from the first size;
applying the second delta to an uncompressed baseline precursor segment corresponding to the first baseline compressed segment to generate a first updated compressed segment having the second size; and
replacing the first intermediate compressed segment in the intermediate firmware with the first updated compressed segment to generate an updated firmware.

11. The method of claim 10, wherein applying the second delta to an uncompressed precursor segment to generate a first updated compressed segment comprises:
applying the second delta file to the uncompressed baseline precursor segment to generate an uncompressed updated precursor segment; and
compressing the uncompressed updated precursor segment to generate the first updated compressed segment.

12. The method of claim 11, comprising dynamically generating the uncompressed baseline precursor segment by decompressing the first baseline compressed segment.

13. The method of claim 11, comprising retrieving the uncompressed baseline precursor segment from the memory.

14. The method of claim 10, wherein the first intermediate compressed segment is a subsection of the first baseline compressed segment.

15. The method of claim 10, wherein the first intermediate compressed segment comprises the first baseline compressed segment and padding bits.

16. The method of claim 10, wherein the first and second delta files are received via the radio transceiver.

17. The method of claim 10, further comprising:
receiving a third delta file for a second baseline compressed segment;
applying the third delta file to the second baseline compressed segment to generate a second updated compressed segment; and
replacing a second intermediate compressed segment in the intermediate firmware with the second updated compressed segment to generate the updated firmware.

18. The method of claim 10, wherein the size of the first intermediate compressed segment is the same as the size of the first updated compressed segment.

* * * * *